United States Patent
Renane et al.

(10) Patent No.: US 10,304,529 B2
(45) Date of Patent: May 28, 2019

(54) READING CIRCUIT FOR RESISTIVE MEMORY

(71) Applicants: Commissariat à l'Énergie Atomique et aux Énergies Alternatives, Paris (FR); Centre National de la Recherche Scientifique, Paris (FR)

(72) Inventors: Salim Renane, Grenoble (FR); Pierre Paoli, Grenoble (FR); Virgile Javerliac, Grenoble (FR)

(73) Assignees: Commissariat à l'Énergie Atomique et aux Énergies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 15/531,782

(22) PCT Filed: Dec. 1, 2015

(86) PCT No.: PCT/FR2015/053273
§ 371 (c)(1),
(2) Date: May 31, 2017

(87) PCT Pub. No.: WO2016/087763
PCT Pub. Date: Jun. 9, 2016

(65) Prior Publication Data
US 2017/0271005 A1 Sep. 21, 2017

(30) Foreign Application Priority Data
Dec. 1, 2014 (FR) ...................................... 14 61717

(51) Int. Cl.
*G11C 13/00* (2006.01)
*G11C 7/06* (2006.01)
(Continued)

(52) U.S. Cl.
CPC .............. *G11C 13/004* (2013.01); *G11C 7/06* (2013.01); *G11C 11/1673* (2013.01);
(Continued)

(58) Field of Classification Search
CPC ................................................... G11C 13/0004
(Continued)

(56) References Cited

U.S. PATENT DOCUMENTS 7,286,429 B1 * 10/2007 Liaw ........................ G11C 7/02
365/158
2002/0126524 A1 9/2002 Sugibayashi et al.
(Continued)

FOREIGN PATENT DOCUMENTS

EP 0297777 A2 1/1989
EP 1220228 A1 7/2002

OTHER PUBLICATIONS

Written Opinion of the International Searching Authority for International Application No. PCT/FR2015/053273 dated May 11, 2016.
(Continued)

*Primary Examiner* — Min Huang
(74) *Attorney, Agent, or Firm* — Wolf, Greenfield & Sacks, P.C.

(57) ABSTRACT

A circuit for reading a programmed resistive state of resistive elements of a resistive memory, wherein each resistive element may be programmed to be in a first or a second resistive state, wherein the circuit includes a current integrator suitable for integrating a difference in current between a reading current flowing through a first of the resistive elements and a reference current.

15 Claims, 4 Drawing Sheets

(51) Int. Cl.
*G11C 11/16* (2006.01)
*G11C 11/22* (2006.01)

(52) U.S. Cl.
CPC ...... *G11C 11/2273* (2013.01); *G11C 13/0004* (2013.01); *G11C 13/0007* (2013.01); *G11C 2013/005* (2013.01); *G11C 2013/0054* (2013.01); *G11C 2207/063* (2013.01); *G11C 2207/068* (2013.01)

(58) Field of Classification Search
USPC ..................................................... 365/148
See application file for complete search history.

(56) References Cited

U.S. PATENT DOCUMENTS

| | | | | |
|---|---|---|---|---|
| 2004/0109353 | A1* | 6/2004 | Matsuoka | G11C 11/5685 365/185.2 |
| 2006/0126389 | A1* | 6/2006 | Sarig | G11C 16/0491 365/185.21 |
| 2007/0014144 | A1* | 1/2007 | Wicker | G11C 11/56 365/148 |
| 2007/0019465 | A1* | 1/2007 | Bedeschi | G11C 7/062 365/163 |
| 2007/0170956 | A1* | 7/2007 | Su | G11C 7/062 327/55 |
| 2007/0247940 | A1* | 10/2007 | Liaw | G11C 7/02 365/208 |
| 2007/0279968 | A1* | 12/2007 | Luo | G11C 8/12 365/158 |
| 2009/0268538 | A1* | 10/2009 | Fukushima | G05F 3/262 365/208 |
| 2011/0235392 | A1* | 9/2011 | Kawaguchi | G11C 8/08 365/148 |
| 2013/0082936 | A1* | 4/2013 | Islamkulov | H01L 27/14609 345/173 |
| 2015/0287458 | A1* | 10/2015 | Pellizzer | G11C 11/56 365/163 |

OTHER PUBLICATIONS

International Search Report for Application No. PCT/FR2015/053273 dated May 11, 2016.
Drennan et al., Understanding MOSFET mismatch for analog design. IEEE Journal of Solid-State Circuits. Mar. 2003;38(3):450-6.
Hass et al., Magnetic Shadow RAM. IEEE 7th Annual Non-Volatile Memory Technology Symposium. 2006:45-8.

* cited by examiner

READING CIRCUIT FOR RESISTIVE MEMORY

This application is the national phase of International Application No. PCT/FR2015/053273, filed on Dec. 1, 2015, which claims priority to French Patent Application No. 14/61717, filed on Dec. 1, 2014, both of applications are incorporated herein by reference to the maximum extent allowable.

FIELD

The present disclosure relates to the field of resistive memories, and in particular to a readout circuit for a resistive memory.

BACKGROUND

It has been proposed to provide a non-volatile memory cell in the form of a programmable resistive element. Such resistive elements are programmable to adopt one of high and low resistive states. The programmed resistive state is maintained even when a supply voltage of the memory cell is disconnected, and therefore data can be stored by such an element in a non-volatile fashion.

A resistive memory is a device that comprises a plurality of memory cells each comprising a resistive element, the cells for example forming an array. To read the programmed data from one of the memory cells of the resistive memory, the memory cell is selected, and a current is passed through the resistive element of the cell. The high or low resistive state of the resistive element can then be detected by measuring the level of current passing through the resistive element.

A difficulty is that, in order to keep energy consumption and chip area relatively low, the high and low resistive states tend to have relatively similar resistances. Furthermore, process dispersion may lead to the real resistances being even closer. For example, for an average resistance of around 4 k ohms, the difference between the high and low resistive states may be as low as 200 ohms, in other words only around 5 percent. There is thus a technical need in the art for a read circuit capable of accurately detecting such a low current variation resulting from the two resistive states.

SUMMARY

It is an aim of embodiments of the present disclosure to at least partially address one or more needs in the prior art.

According to one aspect, there is provided a read circuit for reading a programmed resistive state of resistive elements of a resistive memory, each resistive element being programmable to have one of first and second resistive states, the circuit comprising: a current integrator adapted to integrate a current difference between a read current flowing through a first of the resistive elements and a reference current.

According to an embodiment, the current integrator comprises a capacitive trans-impedance amplifier.

According to an embodiment, the read circuit further comprising a current mirror comprising a first branch adapted to conduct the reference current, and a second branch coupled to: a first line coupled to the first resistive element for conducting the read current; and a second line coupled to the current integrator for conducting the difference between the read current and the reference current.

According to an embodiment, the current integrator comprises a differential amplifier having: a first input node coupled to the second line; a feedback path comprising a capacitor coupled between an output node of the differential amplifier and the first input node; and a second input node coupled to a first reference voltage.

According to an embodiment, the first branch of the current mirror is coupled to a reference current generation block, and the second input node of the differential amplifier is coupled to the first branch.

According to an embodiment, the read circuit further comprises a selection and biasing circuit for selecting the first resistive element and applying a biasing voltage to the first resistive element, the selection and biasing circuit comprising: a first transistor coupled to the first resistive element and adapted to conduct the read current, the first transistor having a control node coupled to the biasing voltage.

According to an embodiment, the first transistor is a MOS transistor, and the selection and biasing circuit further comprises: a second transistor coupled by its main conducting nodes between the gate of the first transistor and a ground level; and a third transistor coupled by its main conducting nodes between a source of the first transistor and the ground level.

According to an embodiment, the selection and biasing circuit further comprises a further transistor coupled in series with the first transistor.

According to an embodiment, the first transistor is an n-channel MOS transistor, and the further transistor is a p-channel MOS transistor having its source coupled to a drain of the first transistor.

According to an embodiment, the reference current is generated by a reference current generation block comprising a K by K array of resistive elements, where K is a positive even integer equal to 2 or more.

According to an embodiment, the array of resistive elements comprises K rows of resistive elements, the resistive elements of each row being coupled in parallel with each other, the rows of resistive elements being coupled in series with each other, and the resistive elements in one half of the rows are programmed to have the high resistive state, and the resistive elements in the other half of the rows are programmed to have the low resistive state.

According to an embodiment, the reference current is generated by a reference current generation block comprising a reference resistive element dimensioned and programmed such that its resistance is at a level between the resistances of the first and second resistive states of each resistive element.

According to an embodiment, the resistive memory comprises a plurality of columns of resistive elements, and the read circuit comprises a current integrator for each column, and a reference current generation block common to a plurality of the columns.

According to an embodiment, each of the resistive elements is one of: a spin transfer torque element with in-plane anisotropy; a spin transfer torque element with perpendicular-to-plane anisotropy; a reduction oxide element; a ferroelectric element; and a phase change element.

According to a further aspect, there is provided a method of reading a programmed resistive state of resistive elements of a resistive memory, each resistive element being programmable to have one of first and second resistive states, the method comprising: selecting a first of the resistive elements; and integrating, by a current integrator, a current difference between a read current flowing through a first of the resistive elements and a reference current.

According to an embodiment, the reference current is generated by a reference branch of a current mirror, and integrating said current difference is based on a reference voltage of said reference branch.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to refer to direct connections between one element and another, while the term "coupled" implies that the connection between the two elements may be direct, or via an intermediate element, such as a transistor, resistor or other component.

Figure 1:
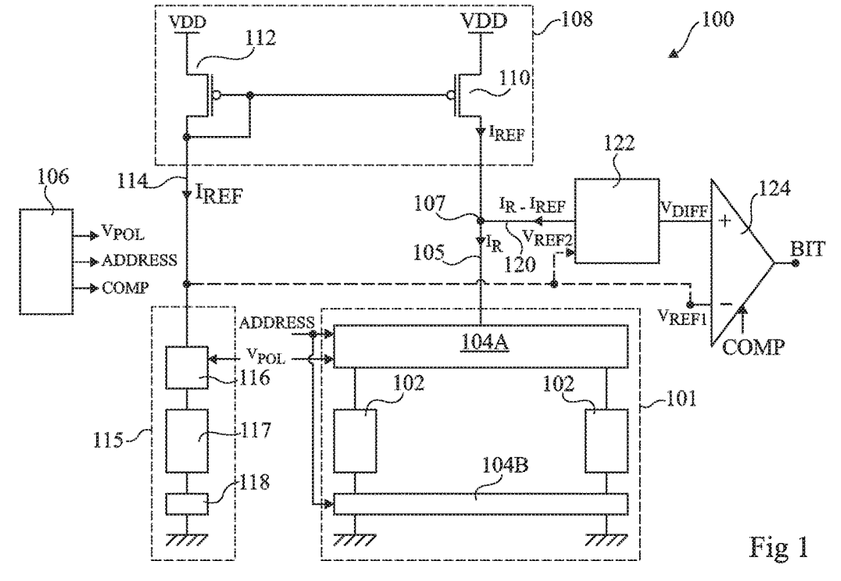
FIG. 1 schematically illustrates a non-volatile memory according to an embodiment of the present disclosure.

FIG. 1 schematically illustrates a non-volatile memory 100 comprising a resistive memory 101 having a plurality of resistive elements 102. The resistive elements 102 for example form an array and although not illustrated in FIG. 1, they may be arranged in a grid of rows and columns. The memory elements 102 could also form other types of resistive memory, such as one or more registers.

The resistive elements 102 are each capable of being programmed to have one of two resistive states. The resistive elements 102 may be any type of resistance switching element for which the resistance is programmable by the direction of the current passing through it, and/or by other means, such as by applying a magnetic field close to the element. For example, the resistive elements 102 are spin-transfer torque (STT) elements with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. Alternatively, the resistive elements could be those used in RedOx RAM (reduction oxide RAM) resistive switching memories, which are for example described in more detail in the publication entitled "Redox-Based Resistive Switching Memories—Nanoionic Mechanisms, Prospects and Challenges", Rainer Waser et al., Advanced Materials 2009, 21, pages 2632 to 2663. As yet a further example, the resistive elements could be those used in FeRAM (Ferro-Electric RAM) or in PCRAM (phase change RAM).

Whatever the type of resistive elements, a bit of data is for example stored in each element in a non-volatile manner by programming the element to have a relatively high resistance (Rmax) or a relatively low resistance (Rmin). Each resistive element 102 for example has just two resistive states corresponding to the high and low resistances $R_{max}$ and $R_{min}$, but the exact values of $R_{min}$ and $R_{max}$ may vary depending on conditions such as process, materials, temperature variations etc.

The resistive elements 102 are for example adapted such that $R_{max}$ is always significantly greater than $R_{min}$, for example at least 5 percent greater. In general, the ratio between the resistance Rmax and the resistance Rmin is for example between 1.05 and 100. Rmin and Rmax are each for example in the range 1 to 10 k ohms, and the difference between Rmin and Rmax is for example in the region of 100 ohms to 4 k ohms, although many other values are possible.

The resistive memory 101 for example comprises a selection and biasing circuit 104A, 104B permitting a resistive element to be selected during a read operation, and a biasing voltage $V_{POL}$ to be applied across the selected resistive element in order to create a read current $I_R$ through the resistive element 102. The circuit 104A for example allows each of the resistive elements 102 to be selectively coupled to a line 105, and also allows the biasing voltage $V_{POL}$ to be applied to one node of each resistive element 102. In some embodiments, a further circuit 104B is also provided for selectively coupling each resistive element 102 to a ground voltage, and permitting a further level of selection to be made. The circuits 104A and 104B each, for example, receive an address signal ADDRESS indicating which resistive element 102 of the resistive memory 101 is to be read. The signals $V_{POL}$ and ADDRESS are for example generated by a control block 106, which for example receives a clock signal CLK.

The line 105 is coupled to a node 107, which is in turn coupled to one branch of a current mirror 108. The current mirror 108 is for example formed of a pair of transistors 110, 112, each of which is for example a p-channel MOS (PMOS) transistor. For example, the transistor 110 has its main conducting nodes, for example its source/drain nodes, coupled to a supply voltage VDD and to the node 107 respectively, and its control node coupled to the control node of transistor 112. Transistor 112 for example has its main conducting nodes coupled to the supply voltage VDD and to a line 114 respectively. The line 114 is also for example coupled to the control nodes of the transistors 110, 112.

The line 114 conducts a reference current $I_{REF}$, which is for example generated by a reference current generation block 115. The block 115 for example comprises a biasing circuit 116 coupling the line 114 to a reference resistive block 117. In some embodiments, the reference resistive block 117 is coupled to ground via a dummy selection block 118 that matches the characteristics of the circuit 104B of the resistive memory 101. In some embodiments, the reference resistive block 117 is adapted to have a resistance equal to the average resistance of the high and low resistances of each resistive element 102 of the resistive memory, in other words substantially equal to (Rmin+Rmax)/2, where the term "substantially" implies a tolerance equal for example to +/−2 percent.

The node 107 is further coupled to a current integrator 122 via a line 120. The transistor 110 of the current mirror 108 for example conducts a current $I_{REF}$ equal to the reference current on the line 114, and thus the line 120 for examples conducts a current towards the node 107 equal to $I_R-I_{REF}$, in other words equal to the difference between the read current and the reference current $I_{REF}$. This current difference is for example positive in the case that the selected resistive element 102 has the low resistive state Rmin, and negative in the case that the selected resistive element 102 has the high resistive state Rmax.

The current integrator 122 provides a signal $V_{DIFF}$, which is for example positive in the case that the current $I_R-I_{REF}$ is positive, and negative in the case that the current $I_R-I_{REF}$ is negative. This voltage $V_{DIFF}$ is for example compared to a reference voltage $V_{REF1}$ by a comparator 124 in order to provide an output data signal BIT indicating the binary value stored by the selected resistive element 102 that is being read. The comparator 124 is for example controlled to sample the signal $V_{DIFF}$ by a control signal COMP generated by the control block 106.

In one embodiment, the reference voltage $V_{REF1}$ is equal to the ground voltage. Alternatively, the reference voltage $V_{REF1}$ is equal to the voltage on line 114 of the reference branch of the current mirror 108. Furthermore, the current integration performed by the current integrator 122 is for example performed with respect to a reference voltage $V_{REF2}$, which could be the same or different to the reference voltage $V_{REF1}$, for example being equal to the ground voltage, or to the voltage on the line 114. Advantageously, in the case that the reference voltages $V_{REF1}$ and $V_{REF2}$ are both equal to the voltage on line 114, there will be drain-source voltage matching for both of the PMOS transistors 110, 112 of the current mirror 108, leading to a good matching between the reference currents $I_{REF}$ in each PMOS transistor 110, 112 of the current mirror 108.

Figure 2:
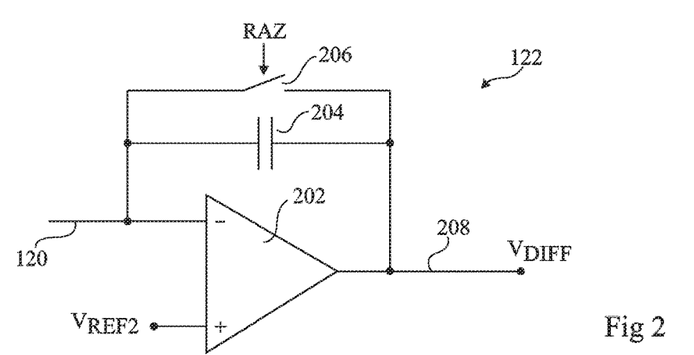
FIG. 2 schematically illustrates a current integrator of FIG. 1 in more detail according to an example embodiment.

FIG. 2 illustrates the current integrator 122 of FIG. 1 in more detail according to an example in which it is implemented by a capacitive trans-impedance amplifier (CTIA). Of course, in alternative embodiments, other types of current integrators could be used.

The line 120 from node 107 is for example coupled to a negative input node of a differential amplifier 202, which for example has its positive input node coupled to the reference voltage $V_{REF2}$. The input line 120 is also coupled, via a feedback path comprising the parallel connection of a capacitor 204 and a switch 206, to an output line 208 of the differential amplifier 202. The switch 206 is for example controlled by a reset signal RAZ. The capacitor 204 for example has a capacitance in the range 1 fF to 100 fF. The output line 208 for example provides the voltage signal $V_{DIFF}$.

Operation of the circuit of FIGS. 1 and 2 will now be described in more detail with reference to the timing diagram of FIG. 3.

Figure 3:
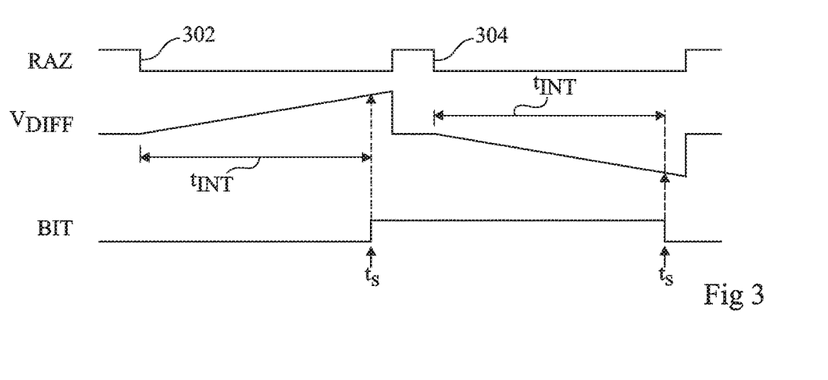
FIG. 3 is a timing diagram representing signals in the circuit of FIG. 2 according to an example embodiment.

FIG. 3 illustrates examples of timing of the reset signal RAZ, the voltage $V_{DIFF}$, and the output signal BIT.

Initially, the reset signal RAZ is for example asserted such that the switch 206 is conducting, and the voltage across the capacitor 204 is reset to a low level of around 0 V.

The reset signal RAZ is brought low with a falling edge 302, triggering an integration period of the current $I_R-I_{REF}$ on the line 120. In the example of FIG. 3, the signal $V_{DIFF}$ increases, implying that the current $I_R-I_{REF}$ is positive, in other words it is flowing towards the node 107. At a sampling time $t_S$ at the end of an integration period $t_{INT}$, the comparator 124 is for example clocked by the signal COMP to sample the signal $V_{DIFF}$, and the output of the comparator thus goes high.

FIG. 3 also illustrates an example of the subsequent cycle during which the reset signal RAZ is again applied, causing the voltage across the capacitor 204 to be reset, and a falling edge 304 of the reset signal causes a new integration period $t_{INT}$ to start. This time, the output signal $V_{DIFF}$ goes low due to a negative current on line 120.

Figure 4:
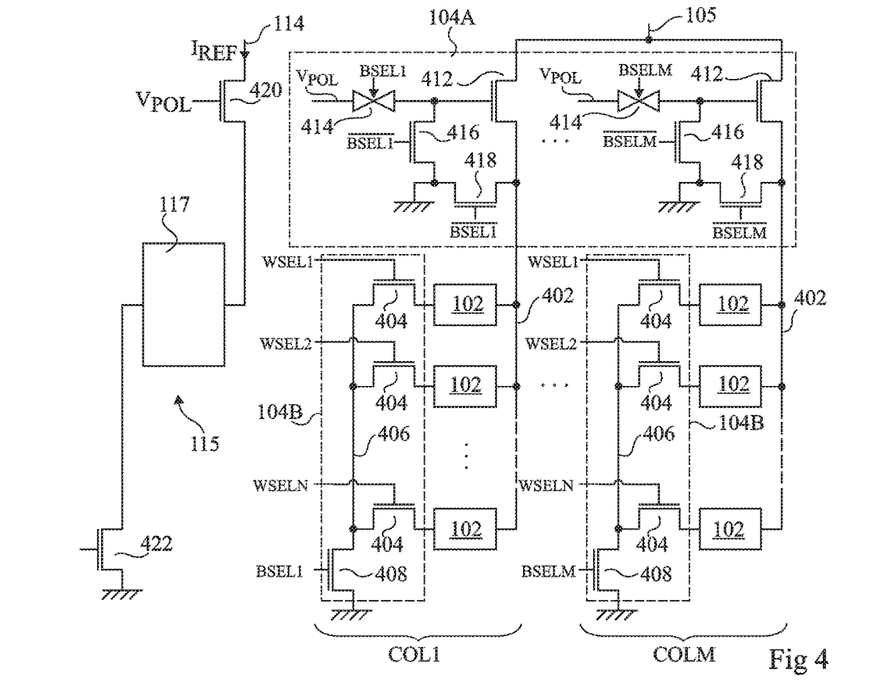
FIG. 4 schematically illustrates circuits of FIG. 1 in more detail according to an example embodiment.

FIG. 4 schematically illustrates the resistive memory 101 and the reference current generation block 115 of FIG. 1 in more detail according to an example embodiment.

In the example of FIG. 4, the resistive memory 101 comprise M columns COL1 to COLM, each column comprising N resistive elements, where M and N are each positive integers equal to 2 or more. In each column, the N resistive elements 102 have one of their nodes coupled to a common line 402, and their other node coupled to the selection circuit 104B. In the example of FIG. 4, the selection circuit 104B comprises, for each resistive element 102, a corresponding transistor 404 coupling it to a line 406. The selection circuit 104B also for example comprises a transistor 408 coupling the line 406 to ground. The transistors 404 and the transistor 408 are all for example NMOS transistors. The transistors 404 for the N elements are for example controlled by control signals WSEL1 to WSELN respectively.

The selection and biasing circuit 104A for example comprises, for each column, a transistor 412 having one of its main conducting nodes coupled to the line 105, and the other of its main conducting nodes coupled to the line 402. The control node of transistor 412 is for example coupled via a switch 414 to an input line receiving the biasing voltage $V_{POL}$. The switches 414 of the columns COL1 to COLM are for example controlled by corresponding control signals BSEL1 to BSELM forming part of the address signal ADDRESS. The transistor 412 is for example an NMOS transistor, and its gate node and source node are for example each coupled to ground by a corresponding transistor 416, 418. The transistors 416 and 418 of the columns COL1 to COLM are for example NMOS transistors controlled at their gate nodes by signals $\overline{BSEL1}$ to $\overline{BSELM}$ respectively.

The reference current generation block 115 for example comprises a transistor 420 forming the circuit 116 and coupled by its main conducting nodes between the line 114 and the reference resistive block 117. The transistor 420 is for example an NMOS transistor and has its control node coupled to the biasing voltage $V_{POL}$. The reference resistive block 117 is also for example coupled to ground via a transistor 422, which is for example an NMOS transistor adapted to have characteristics similar to those of the transistor 408 of each column of the resistive memory 101.

Figure 5:
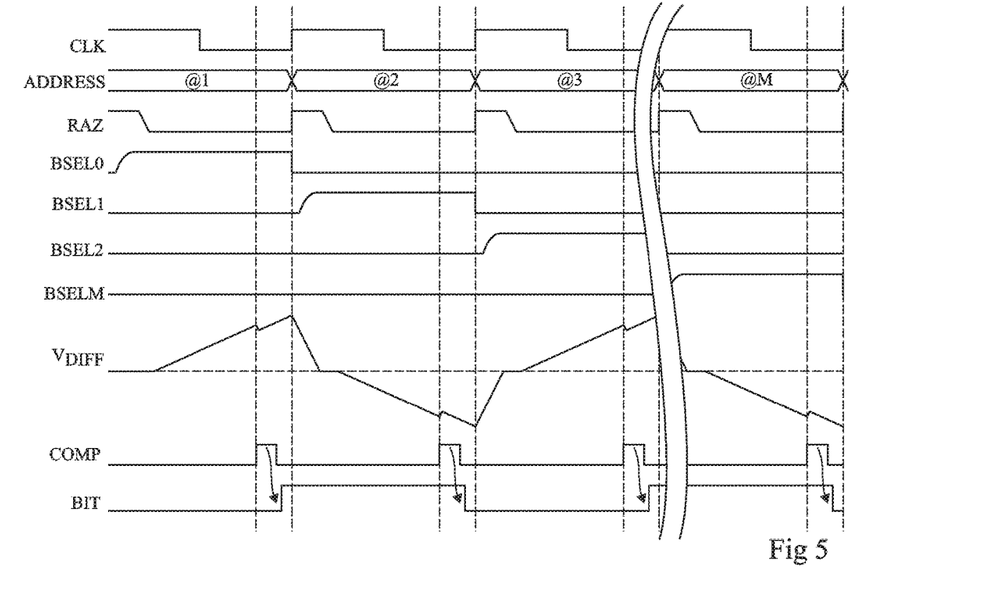
FIG. 5 is a timing diagram illustrating signals in the circuit of FIG. 4 according to an embodiment of the present disclosure.

FIG. 5 is a timing diagram showing examples of signals in the circuit of FIGS. 1 and 4 according to an example embodiment. In particular, FIG. 5 shows the signals CLK, ADDRESS, RAZ, BSEL1, BSEL2, BSEL3, BSELM, $V_{DIFF}$, COMP and BIT.

As illustrated, during a first read period, a first resistive element at address @1 is selected by asserting one of the word line signals WSEL1 to WSELN (not illustrated in FIG. 5) and selecting a first bit by asserting the control signal BSEL1.

A short time later, the signal RAZ is brought low, from a high state to a low state, to activate the current integrator 122. In the example of FIG. 5, the signal $V_{DIFF}$ then rises until a time at which the signal COMP goes high causing the comparator 124 to sample the input signal. The signal BIT at the output of comparator 124 thus goes high a short time later.

The signal $V_{DIFF}$ for example has a small step when the signal COMP is asserted, and then continues to rise until the reset signal RAZ is asserted again on a subsequent rising edge of the clock signal CLK.

Several subsequent read cycles are also illustrated in FIG. 5, corresponding to read operations at addresses @2, @3 up to the address @M, which for example correspond to resistive elements in column 2 to M.

Figure 6A:
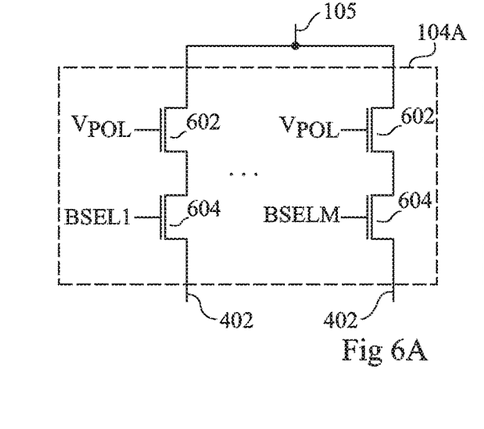
FIGS. 6A and 6B each schematically illustrate a switching circuit of FIG. 1 according to alternative embodiments of the present disclosure.

FIG. 6A schematically illustrates the selection and biasing circuit 104A of FIG. 4 in more detail according to an alternative embodiment to that of FIG. 4. For each column COL1 to COLM, the circuit 104A for example comprises a pair of transistors 602 and 604 coupled in series via their main conducting nodes between the line 105 and the line 402 of the respective column. The transistors 602 and 604 are both for example NMOS transistors. The transistors 602 for example have their drains coupled to the node 105, and are for example controlled by the biasing voltage $V_{POL}$. The transistor 604 of each column COL1 to COLM is for example controlled by the corresponding selection signal BSEL1 to BSELM, and has its source coupled to the corresponding line 402.

Figure 6B:
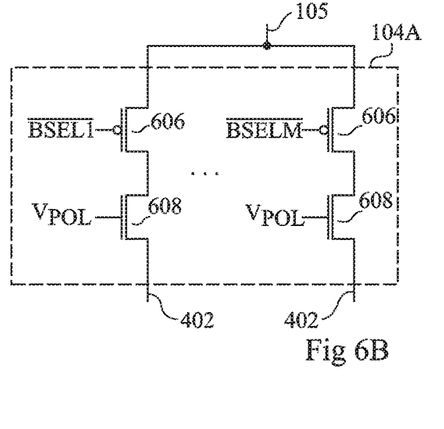

FIG. 6B schematically illustrates the selection and biasing circuit 104A of FIG. 4 in more detail according to yet a further alternative embodiment. For each column COL1 to COLM, the circuit 104A for example comprises a pair of transistors 606 and 608 coupled in series via their main conducting nodes between the line 105 and the line 402 of the respective column. The transistors 606 are for example PMOS transistors having their source nodes coupled to the line 105, and respectively controlled by the inverse $\overline{BSEL1}$ to $\overline{BSELM}$ of the corresponding selection signal. The transistors 608 are for example NMOS transistors having their source nodes coupled to the corresponding line 402, and each controlled at its gate node by the biasing voltage $V_{POL}$.

An advantage of the circuit of FIG. 6B is that the circuit has a high yield because the biasing voltage $V_{POL}$ is applied by transistors 608 to the lines 402 without intermediate components.

Figure 7A:
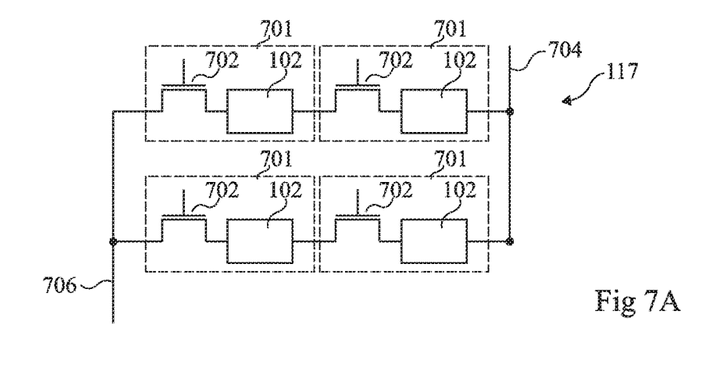
FIGS. 7A to 7C each schematically illustrate reference current generation blocks of FIG. 1 in more detail according to alternative embodiments of the present disclosure.
Figures 7B, 7C:
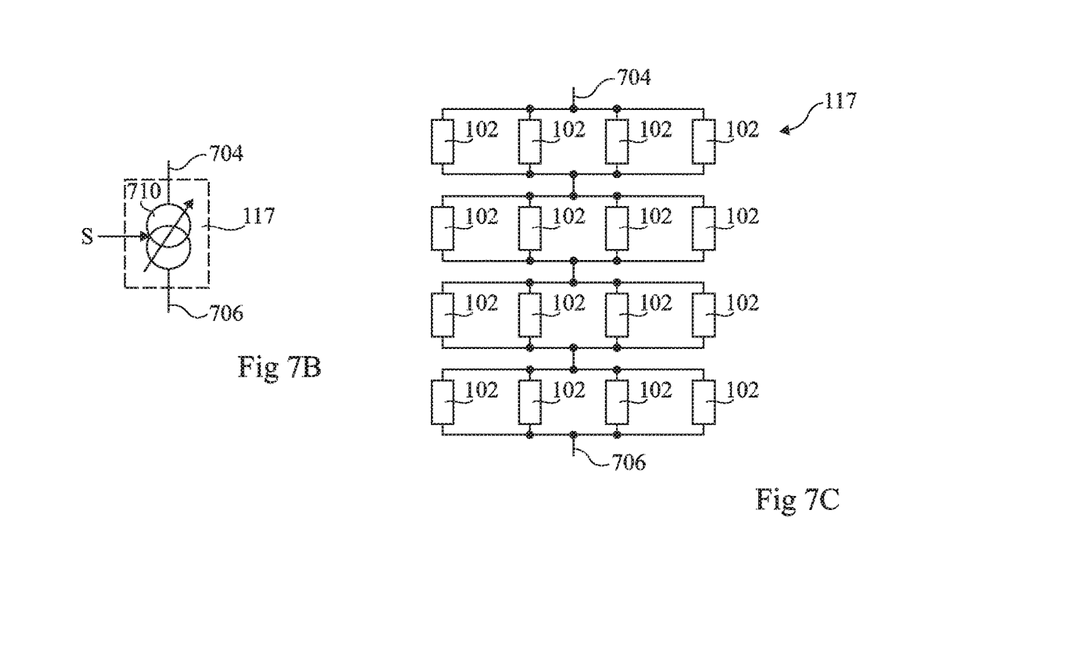

FIGS. 7A to 7C schematically illustrate the block 117 of the reference current generation block 115 in more detail according to example embodiments.

In the embodiment of FIG. 7A, the block 117 is for example formed by an arrangement of K by K reference cells 701, where K is equal to two, but in alternative embodiments K could be any even integer equal to 2 or more. Each cell 701 for example comprises a resistive element 102 similar to those of the resistive memory 101 of FIG. 1, coupled in series with a transistor 702. The transistors 702 are all for example NMOS transistors, and each has its source or drain node coupled to one node of the corresponding resistive element 102, and its control node coupled to a high voltage, such that it is permanently activated. The cells 701 of each row of cells are for example coupled in series with each other between input/output lines 704, 706 of the block 117, and the rows are for example coupled in parallel with each other between the input/output lines 704, 706. Thus the overall resistance of the block between the input/output lines 704, 706 is equal to the average resistance of the cells 701. The resistive elements 102 of half of the rows and/or half of the columns of cells are for example adapted to have a high programmed resistance of Rmax, while the other resistive elements are for example programmed to have a low programmed resistance of Rmin.

FIG. 7B illustrates the block 117 of the reference current generation block 115 in more detail according to an alternative example to that of FIG. 7A in which it is implemented by a variable current source 710. The variable current source 710 is for example a current source that can be calibrated, for example during a calibration phase of the memory, based on test data stored in the resistive memory 101 and read by the read circuit. The current source 710 is for example controlled by a control signal S, for example a voltage level. The variable current source 710 is for example implemented by one or more poly resistors, one or more diffusion resistors, and/or one or more NMOS current sources. Alternatively, the variable current source 710 could be implemented by one or more external current sources, in other words current sources that are either positioned outside the non-volatile memory but in the same integrated circuit, or positioned in another integrated circuit, coupled to the non-volatile memory by an IO PAD.

FIG. 7C illustrates the block 117 of the reference current generation block 115 in more detail according to an alternative example to that of FIGS. 7A and 7B in which it is implemented by an arrangement of L by L resistive elements 102, where L is equal to four in the example of FIG. 7C. In alternative embodiments, L could be any even integer of 2 or more. The resistive elements 102 of each row are for example coupled in parallel with each other, and the rows are coupled in series between the lines 704 and 706. The resistive elements 102 of half of the rows are for example programmed to have a high resistance of Rmax, and the resistive elements of the other half of the rows are for example programmed to have a low resistance of Rmin, such that the overall resistance of the block 116 between the lines 704, 706 is equal to (Rmax+Rmin)/2.

As a further example, the block 117 of the reference current generation block 115 could comprise a reference resistive element coupled between the input and output lines 704, 706 and programmed to have a resistance substantially equal to the average of the resistances Rmin and Rmax of the resistive elements of the non-volatile memory. For example, the reference resistive element is a magnetic tunnel junction that is permanently programmed in the anti-parallel state, and dimensioned such that its resistance in this state is substantially equal to (Rmin+Rmax)/2.

Figure 8:
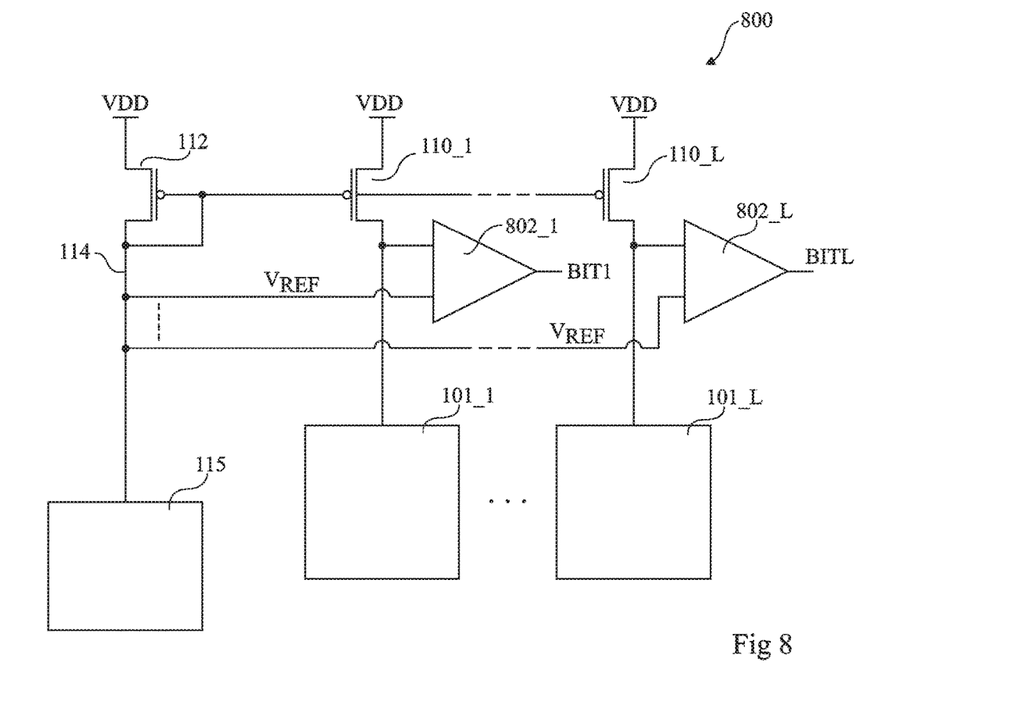
FIG. 8 schematically illustrates a non-volatile memory according to a further embodiment of the present disclosure.

FIG. 8 schematically illustrates a non-volatile memory device 800 according to a further example embodiment.

Like the embodiment of FIG. 1, the device 800 comprises a current mirror having one branch comprising a transistor 112 coupled to a reference current generation block 115. However, rather than having one other branch coupled to the resistive memory 101, there are a plurality L of further branches, each comprising a corresponding transistor 110-1 to 110_L having its control node coupled to the control node of the transistor 112. Each further branch is coupled to a corresponding resistive memory 101-1 to 101_L, and to a corresponding block 802_1 to 802_L. Each of the blocks 802_1 to 802_L for example comprises the current integrator 122 and comparator 124 of FIG. 1, for generating corresponding signals BIT1 to BITL. Each of the blocks 802_1 to 802_L receives a reference voltage $V_{REF}$, which is for example equal to voltage on line 114 of the reference branch, or receives the reference voltages $V_{REF1}$ and/or $V_{REF2}$ used by the current integrator 122 and comparator 124 of the blocks 802_1 to 802_L.

Figure 9A:
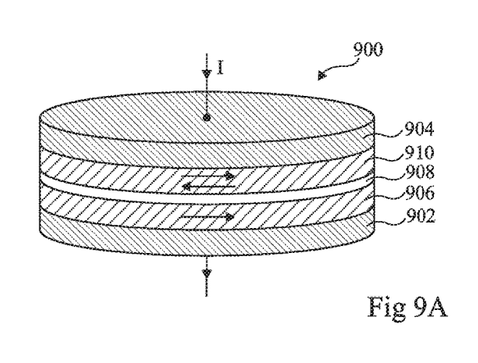
FIGS. 9A and 9B illustrate resistive elements based on magnetic tunnel junctions according to embodiments of the present disclosure.
Figure 9B:
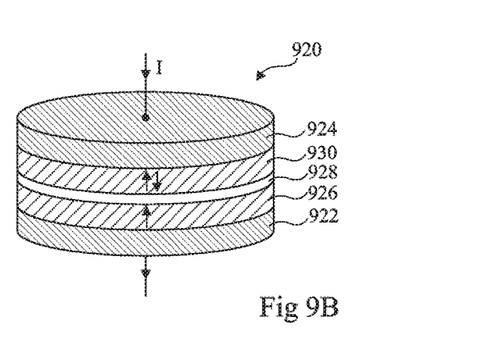

FIGS. 9A and 9B illustrate the structures of resistive spin transfer torque (STT) elements according to an example embodiment. For example, the resistive element 102 described herein has a structure corresponding to that of FIG. 9A or 9B. Alternatively, as mentioned above, the resistive elements could be RedOx RAM elements, FeRAM elements, PC RAM elements or other types of resistive elements having a programmable resistance.

FIG. 9A illustrates an STT resistive element 900 with in-plane magnetic anisotropy. The element 900 is for example substantially cylindrical, but has a cross-section which is non-circular, for example oval, which leads for example to an increase in the retention stability of the resistive states when the device is programmed.

The element 900 comprises bottom and top electrodes 902 and 904, each being substantially disc-shaped, and sandwiching a number of intermediate layers between them. The intermediate layers comprise, from bottom to top, a pinned layer 906, an oxidation barrier 908, and a storage layer 910.

The oxidation barrier 908 is for example formed of MgO or $Al_xO_y$. The pinned layer 906 and storage layer 910 are for example ferromagnetic materials, such as CoFe. The spin direction in the pinned layer 906 is fixed, as represented by an arrow from left to right in FIG. 9A. Of course, in alternative embodiments the spin direction could be from right to left in the pinned layer 906. However, the spin direction in the storage layer 910 can be changed, as represented by arrows in opposing directions in FIG. 9A. The spin direction is programmed by the direction of the write current I passed through the element, such that the spin direction in the storage layer is parallel, in other words in the same direction, or anti-parallel, in other words in the opposite direction, to that of the pinned layer 906.

FIG. 9B illustrates an STT resistive element 920 with perpendicular-to-plane magnetic anisotropy. Such a resistive element can for example be programmed by a lower write current I than the element 900 for a given size and/or for a given storage layer volume. Such an element is therefore for example used in the memory cell 900 of FIG. 9, where a relatively low write current is desirable.

Element 920 is substantially cylindrical, and for example has a cross-section which is circular. The element 920 comprises bottom and top electrodes 922 and 924, each being substantially disc-shaped and sandwiching a number of intermediate layers. The intermediate layers comprise, from bottom to top, a pinned layer 926, an oxidation barrier 928, and a storage layer 930. These layers are similar to the corresponding layers 906, 908 and 910 of element 900, except that the pinned layer 926 and storage layer 930 have perpendicular-to-plane anisotropy, as represented by the vertical arrows in layers 926 and 930 of FIG. 9B. The pinned layer 926 is illustrated as having a spin direction from bottom to top in FIG. 9B, but of course, in alternative embodiments, this spin direction could be from top to bottom.

If the STT element 900 or 920 of FIG. 9A or 9B is used to implement each of the resistive elements 202, 204 described herein, their orientations can for example be chosen to minimize the level of write current that allows them to be programmed. In particular, depending on factors such as the dimensions of the elements 202, 204, a low write current may be possible when each element has its bottom electrode 902, 922 connected to the corresponding storage node 206, 210, or the opposite may be true.

An advantage of the embodiments described herein is that the read circuit permits a precise detection of the read current flowing through a resistive element during a read operation. Thus the programmable resistive states of the resistive elements forming the resistive memory may have relatively similar resistances, permitting a compact circuit and low energy consumption.

Having thus described at least one illustrative embodiment, various alterations, modifications and improvements will readily occur to those skilled in the art.

For example, it will be apparent to those skilled in the art that the supply voltage VDD in the various embodiments could be at any level, for example between 1 and 3 V, and rather than being at 0 V, the ground voltage can also be considered as a supply voltage that could be at any level, such as a negative level.

Furthermore, it will be apparent to those skilled in the art that columns and rows described herein are interchangeable, in other words the rows could be considered as columns, and vice versa.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors, for example by inverting the supply rails. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A read circuit for reading a programmed resistive state of resistive elements of a resistive memory, each resistive element being programmable to have one of first and second resistive states, the circuit comprising:
   a current mirror comprising a first branch adapted to conduct a reference current generated by a reference current generation block, and a plurality of further branches, a first of the further branches being coupled to:
      a first line coupled to a first of the resistive elements, the first line conducting a first read current flowing through the first resistive element;
      a second line conducting a first current difference between the first read current and the reference current; and
      a first current integrator adapted to integrate the first current difference; and
   a second of the further branches being coupled to:
      a third line coupled to a second of the resistive elements, the third line conducting a second read current flowing through the second resistive element;
      a fourth line conducting a second current difference between the second read current and the reference current; and
      a second current integrator adapted to integrate the second current difference.

2. The read circuit of claim 1, wherein the first current integrator comprises a capacitive trans-impedance amplifier.

3. The read circuit of claim 1, wherein the first current integrator comprising a differential amplifier having:
   a first input node coupled to the second line;
   a feedback path comprising a capacitor coupled between an output node of the differential amplifier and the first input node; and
   a second input node coupled to a first reference voltage.

4. The read circuit of claim 3, wherein the first branch of the current mirror is coupled to the reference current generation block, and wherein the second input node of the differential amplifier is coupled to the first branch.

5. The read circuit of claim 1, further comprising a selection and biasing circuit for selecting the first resistive element and applying a biasing voltage to the first resistive element, the selection and biasing circuit comprising:
  a first transistor coupled to the first resistive element and adapted to conduct the read current, the first transistor having a control node coupled to the biasing voltage.

6. The read circuit of claim 5, wherein the first transistor is a MOS transistor, and the selection and biasing circuit further comprises:
  a second transistor coupled by its main conducting nodes between the gate of the first transistor and a ground level; and
  a third transistor coupled by its main conducting nodes between a source of the first transistor and the ground level.

7. The read circuit of claim 5, wherein the selection and biasing circuit further comprises a further transistor coupled in series with the first transistor.

8. The read circuit claim 7, wherein the first transistor is an n-channel MOS transistor, and wherein the further transistor is a p-channel MOS transistor having its source coupled to a drain of the first transistor.

9. The read circuit of claim 1, wherein the reference current generation block comprises a K by K array of resistive elements, where K is a positive even integer equal to 2 or more.

10. The read circuit of claim 9, wherein the array of resistive elements comprises K rows of resistive elements, the resistive elements of each row being coupled in parallel with each other, wherein the rows of resistive elements are coupled in series with each other, and wherein the resistive elements in one half of the rows are programmed to have the high resistive state, and the resistive elements in the other half of the rows are programmed to have the low resistive state.

11. The read circuit of claim 1, wherein the reference current generation block comprises a reference resistive element dimensioned and programmed such that its resistance is at a level between the resistances of the first and second resistive states of the resistive elements of the resistive memory.

12. The read circuit of claim 1, wherein the resistive memory comprises a plurality of columns of resistive elements, and wherein the read circuit comprises a current integrator for each column, and the reference current generation block is common to a plurality of the columns.

13. The read circuit of claim 1, wherein each of the resistive elements is one of:
  a spin transfer torque element with in-plane anisotropy;
  a spin transfer torque element with perpendicular-to-plane anisotropy;
  a reduction oxide (RedOx) element; and
  a phase change element.

14. A method of reading a programmed resistive state of resistive elements of a resistive memory, each resistive element being programmable to have one of first and second resistive states, the method comprising:
  conducting, by a first branch of a current mirror, a reference current generated by a reference current generation block comprising at least one resistive element, the current mirror comprising a plurality of further branches;
  selecting a first of the resistive elements to induce a first read current through the first resistive element and through a first line coupled to a first of the further branches; and
  integrating, by a first current integrator, a first current difference between the first read current and the reference current, the first current difference being provided on a second line coupled to the first further branch of the current mirror;
  selecting a second of the resistive elements to induce a second read current through the second resistive element and through a third line coupled to a second of the further branches; and
  integrating, by a second current integrator, a second current difference between the second read current and the reference current, the second current difference being provided on a fourth line coupled to the second further branch of the current mirror.

15. The method of claim 14, wherein integrating said current difference is based on a reference voltage of said first branch.

* * * * *